(12) United States Patent
Zhu

(10) Patent No.: US 8,101,474 B2
(45) Date of Patent: Jan. 24, 2012

(54) STRUCTURE AND METHOD OF FORMING BURIED-CHANNEL GRAPHENE FIELD EFFECT DEVICE

(75) Inventor: Wenjuan Zhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/652,804

(22) Filed: Jan. 6, 2010

(65) Prior Publication Data

US 2011/0163289 A1 Jul. 7, 2011

(51) Int. Cl.
*H01L 21/338* (2006.01)
*H01L 29/66* (2006.01)

(52) U.S. Cl. . 438/175; 438/591; 257/216; 257/E21.409; 257/E29.049

(58) Field of Classification Search .......................... None
See application file for complete search history.

(56) References Cited

U.S. PATENT DOCUMENTS

| | | | |
|---|---|---|---|
| 5,734,181 A | | 3/1998 | Ohba et al. |
| 6,891,227 B2 | | 5/2005 | Appenzeller et al. |
| 7,282,742 B2 | * | 10/2007 | Tsukamoto et al. ............ 257/88 |
| 7,348,675 B2 | | 3/2008 | Dubin et al. |
| 7,952,088 B2 | * | 5/2011 | Anderson et al. ................ 257/24 |
| 2008/0026534 A1 | | 1/2008 | Avouris et al. |
| 2010/0006823 A1 | * | 1/2010 | Anderson et al. ................ 257/24 |
| 2010/0181655 A1 | * | 7/2010 | Colombo et al. .............. 257/635 |
| 2011/0114918 A1 | * | 5/2011 | Lin et al. .......................... 257/24 |

OTHER PUBLICATIONS

Y. Xuan, et al., "Atomic-layer-deposited nanostructures for graphene-based nanoelectronics", Appl. Phys. Lett. 92, 013101 (2008).

* cited by examiner

*Primary Examiner* — Alonzo Chambliss
(74) *Attorney, Agent, or Firm* — Vazken Alexanian

(57) ABSTRACT

A novel buried-channel graphene device structure and method for manufacture. The new structure includes a two level channel layer comprised of a buried-channel graphene layer with an amorphous silicon top channel layer. The method for making such structure includes the steps of depositing a graphene layer on a substrate, depositing an amorphous silicon layer on the graphene layer, converting the upper layer of the amorphous silicon layer to a gate dielectric by nitridation, oxidation or oxynitridation, while keeping the lower layer of the amorphous silicon layer to serve as part of the channel to form the buried-channel graphene device.

15 Claims, 2 Drawing Sheets

STRUCTURE AND METHOD OF FORMING BURIED-CHANNEL GRAPHENE FIELD EFFECT DEVICE

This invention was made with Government support under FA8650-08-C-7838 awarded by Defense Advanced Research Projects Agency. The Government has certain rights to this invention.

FIELD OF THE INVENTION

The present invention is a novel structure for a field effect transistor having a buried channel graphene layer and a method for forming such structure.

BACKGROUND

Graphene has been shown to be an excellent material for use as the channel layer in field effect transistors (FETs). It exhibits high carrier mobility and low noise properties. However, the manufacture of FETs with graphene channel layer has met with certain problems.

One such problem is that the gate dielectric, which must be present between the graphene layer and the gate electrode, usually causes severe degradation of channel mobility in the graphene layer. Commonly used methods for depositing high-K gate dielectrics include atomic level deposition (ALD) and evaporation.

For ALD high-k gate dielectrics, the coverage of the high-k film on graphene is usually poor. To enhance coverage, surface pre-treatment or seed layer are usually used. Such surface pre-treatment or seed layer usually causes severe doping of the graphene and can cause mobility degradation as well. Evaporated high-k gate dielectrics also demonstrate the same problem of degrading mobility of electrons in the graphene layer.

SUMMARY

To overcome these problems, the present invention provides a novel buried-channel graphene FET structure and method for manufacture. The new structure includes a two level channel layer comprised of the buried-channel graphene layer with an amorphous silicon top channel layer.

The method for making such structure includes the steps of depositing a graphene layer on a substrate, depositing an amorphous silicon layer (a-Si) on the graphene layer, converting the upper layer of the a-Si layer to gate dielectrics by nitridation or oxidation, while keeping the bottom of the a-Si layer to serve as part of the channel to form the buried-channel graphene FET.

The advantages of this new structure include: (1) high quality of gate dielectrics with low leakage and low trap density; and (2) high mobility of the underneath graphene channel, since it is protected by the thin a-Si layer during gate dielectric and metal gate electrode formation. This contributes to high speed, low power and long lifetime of the device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. For example, the invention is applicable to all types of graphene devices, including logic, such as field effect transistors, and analog, such as RF amplifiers. Many other modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

Step 1

Figure 1A:
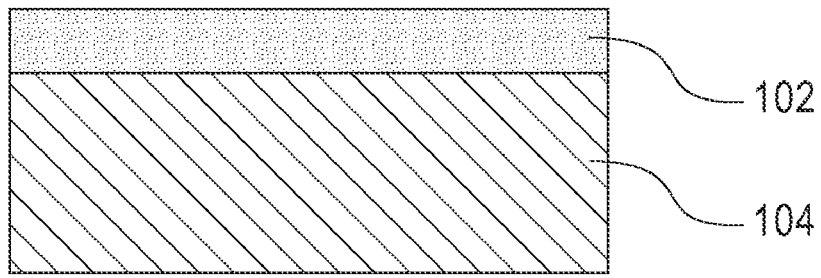
FIGS. 1A-F show lateral views illustrating each step in the manufacture of a field effect transistor having a buried graphene channel that can be implemented within embodiments of the present invention.

With reference to FIG. 1A, Step 1 will now be described. This step is the deposition of a graphene layer 102 on top of a substrate 104. The substrate 104 can be, without limitation, selected from the following substrates: semiconductor substrates such as SiC and Si, insulator substrate such as quartz and sapphire; polymer substrates such as polyethylene terephthalate (PET) and polyethylene naphthalate (PEN); layered substrates such as $SiO_2/Si$, $HfO_2/Si$, $Al_2O_3/Si$, SOI etc, or combinations of various types of substrates.

The graphene layer 102 can be formed by various processes such as sublimation process on SiC wafer, CVD grown in metals substrate (such as Ni or Cu), or mechanical exfoliated from natural graphite, etc. as is well known in the art. The thickness of the graphene layer 102 is in the range of 0.35 nm to 3.5 nm,

Step 2

Figure 1B:
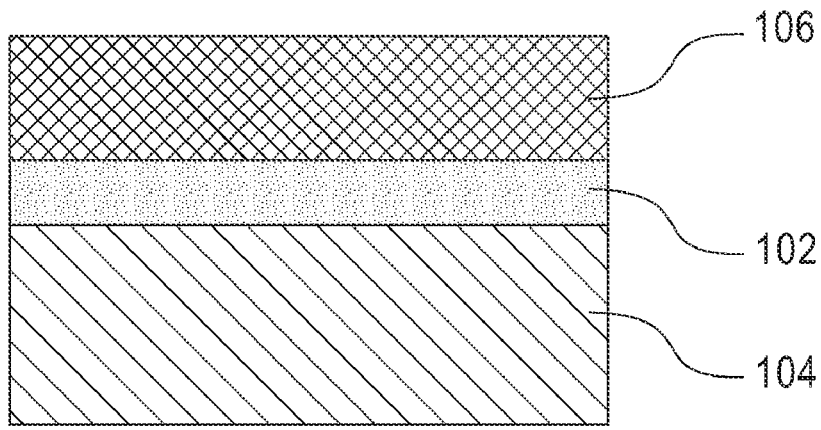

With reference to FIG. 1B, Step 2 will now be described. A layer of amorphous silicon 106 is deposited on top of graphene layer 102. Amorphous silicon layer 106 can be deposited by CVD, e-beam, sputter etc. The thickness of the amorphous silicon layer 106 is in the range of 2 nm to 15 nm.

Step 3

Figure 1C:
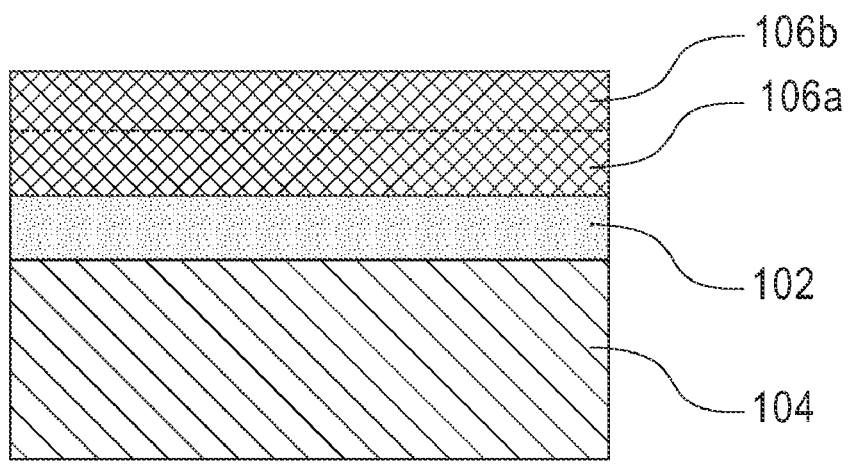
Figure 1D:
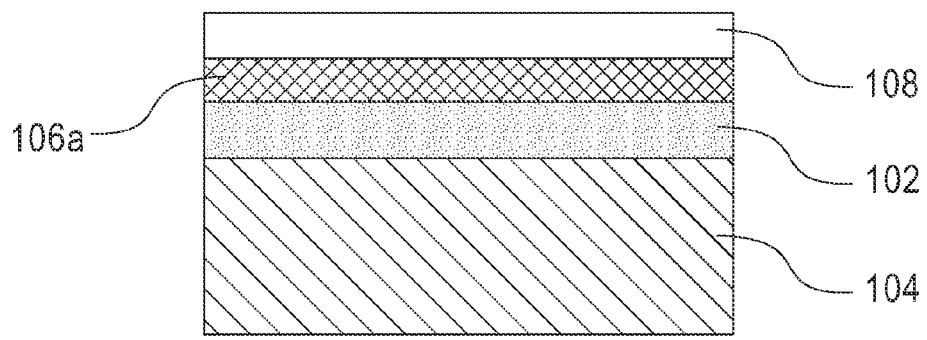

With reference to FIGS. 1C and 1D, Step 3 will now be described. This step is the conversion of the upper layer 106b of amorphous silicon layer 106 into a thin dielectric layer of silicon oxide, silicon nitride or silicon oxynitride. This can be accomplished by oxidizing, nitriding, or oxynitriding using any type of suitable gas, including $O_2$, $O_3$, $H_2O$, $NH_3$, $N_2O$, NO, or $N_2$. The resulting dielectric layer is indicated by reference number 108 in FIG. 1D. The conversion process can be a thermal growth process or can be aided by generating activated metastable atomic or molecular species via plasma, ultraviolet radiation, etc. as well known in the art. Optionally, additional gate dielectric layers (including high-k gate dielectrics) can be added on top of dielectric layer 108 for further reduction of gate leakage current or increase gate dielectric constant.

To achieve a controlled conversion process to ensure that the remaining lower layer of the amorphous silicon layer 106a remains as the surface channel, the process parameters must be selected carefully. Generally, amorphous silicon layer 106 is deposited with a thickness in the range of 2 nm-15 nm. During the nitridation, oxidation or oxynitridation process, 1 nm to 8 nm of the upper layer of the amorphous silicon layer 106b is consumed, which results in a thickness of the dielectric layer of oxide, nitride or oxynitride 108 in the range of 1.1 nm to 15 nm (The thickness ratio of the formed gate dielectrics to the consumed amorphous silicon is dependent on the oxygen/nitrogen ratio in the formed gate dielectrics). This leaves the thickness of the lower layer of amorphous silicon 106a in the range of 1 nm to 7 nm.

In the preferred embodiment, amorphous silicon layer 106 is depositing with a thickness in the range of 3 nm-7 nm. The upper layer of amorphous silicon layer 106b is consumed in the oxidation/nitridation process to a depth of 1.5 nm-4 nm, which results in an oxide, nitride or oxynitride layer 108 in the range of 1.7 nm to 7.6 nm thick. This leaves a lower layer of amorphous silicon 106a in the range of approximately 1.5 nm to 3 nm thick remaining as the surface channel. As one example of the process, the amorphous silicon can be converted to oxynitride using furnace oxynitridation at temperatures in the range of 700° C. to 1000° C. in $N_2O$ for 10 to 40 mins.

The lower layer of amorphous silicon 106a serves as the surface channel while the underneath graphene layer 102 serves as the buried channel. The resulting structure is show in FIG. 1D in which the treated upper layer 106b (FIG. 1C) is now depicted as dielectric layer 108.

Step 4

Figure 1E:
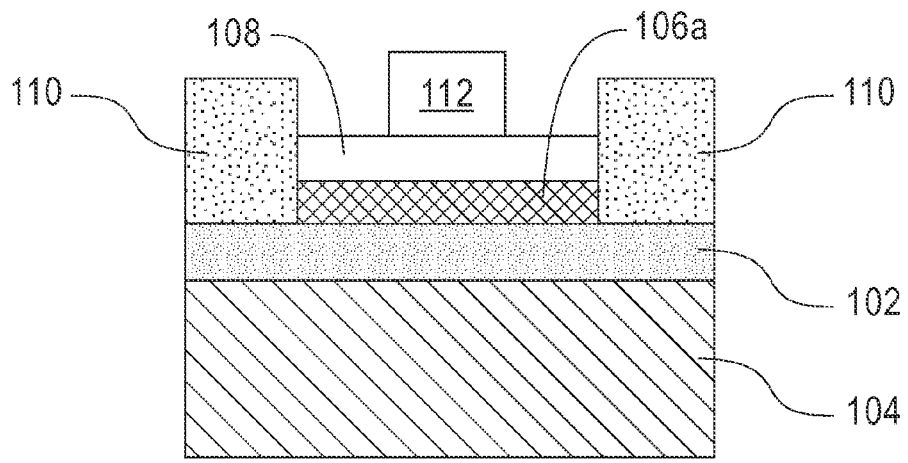
Figure 1F:
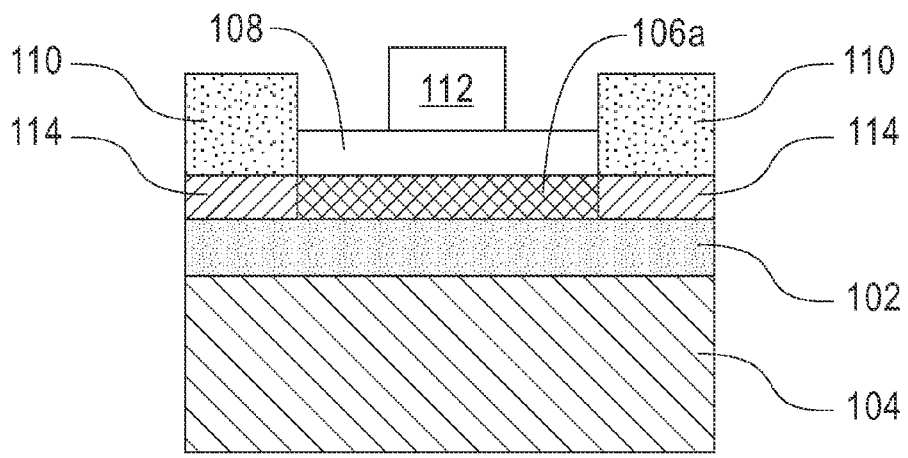

With reference to FIGS. 1E and F, Step 4 will now be described. This step is the formation of source/drain contacts 110 and gate electrode 112. There are 2 options for forming the source/drain contacts 110. Option 1, shown in FIG. 1E, is to etch through the gate dielectric 108 and amorphous silicon layer 106a where the source/drain contacts are to be formed. Etching can be done using well known etch processes and materials such as using wet etch or RIE (reactive ion etch). In the case of wet etch, silicon oxide, silicon nitride or silicon oxynitride can be removed by buffer oxide etch (BHF) and silicon can be removed by ammonia. After the etching is completed, a metal, such as Ti, Pd, Au, Al, TiN, TaN, W or combination of these metals is deposited to create the source/drain contacts 110.

Option 2, shown in FIG. 1E, is to etch through only gate dielectric 108 where the source/drain contacts are to be formed, leaving the thin amorphous silicon layer 106a in place. Then, a metal, such as Ni, NiPt, or Co is deposited on the remaining amorphous silicon layer 106a to form a silicide 114 with metal source/drain contacts 110. If necessary, additional metal can be deposited to complete the metal source/drain contacts 110.

The gate electrode 112 can be formed either before source/drain contacts 110, at the same time or after them as well known in the art. The gate electrode 112 can be polysilicon, silicide, Ti, TiN, W, TaN, Al, Pb, Re, Au, Ni, etc.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for making a graphene device comprising the following steps:
    depositing a layer of graphene on a substrate;
    depositing a layer of amorphous silicon on said graphene layer having an upper layer and a lower layer;
    converting the upper layer of said amorphous silicon layer into a gate dielectric layer;
    forming source and drain contact regions in contact with said graphene layer; and
    forming a gate electrode on said gate dielectric layer in between said source and drain contact regions.

2. The method of claim 1 in which the graphene device can be either a logic device or an analog device.

3. The method of claim 1 in which the substrate is selected from the group consisting of silicon, quartz, sapphire, polymer, polyethylene terephthalate (PET), polyethylene naphthalate (PEN), $SiO_2/Si$, $HfO_2/Si$, $Al_2O_3/Si$, and combinations of said materials.

4. The method of claim 1 in which the thickness of the amorphous silicon layer is in the range from about 2 nm to 15 nm.

5. The method of claim 1 in which the upper layer of said amorphous silicon layer is oxidized, nitrided or oxynitrided to form a gate dielectric layer of silicon oxide, silicon nitride or silicon oxynitride using a gas selected from the group consisting of $O_2$, $O_3$, $H_2O$, $NH_3$, $N_2O$, NO, and $N_2$.

6. The method of claim 1 in which the thickness of the said gate dielectrics converted from the amorphous silicon is in the range of 1.1 nm to 15 nm.

7. The method of claim 1 in which the materials for the source and drain contacts are selected from the group consisting of Ti, Pd, Au, Al, TiN, TaN, W and combinations of these metals.

8. The method of claim 1 in which the lower layer of the amorphous silicon layer at contact area is converted into silicide layer and the metal layer is deposited on top of the silicide layer to form source and drain contact.

9. The method of claim 1 in which the lower layer of the amorphous silicon layer at the contact area is removed and the metal layer is deposited directly on the graphene layer to form source and drain contact.

10. A buried channel graphene device comprising:
a substrate;
a layer of graphene on said substrate;
a layer of amorphous silicon on said graphene layer;
a gate dielectric layer on said amorphous silicon layer;
source and drain contact regions in contact with said graphene layers; and
a gate electrode on said gate dielectric layer in between said source and drain contact regions.

11. The buried channel graphene device of claim 10 in which the substrate is silicon, quartz, sapphire, polymer, polyethylene terephthalate (PET), polyethylene naphthalate (PEN), $SiO_2/Si$, $HfO_2/Si$, $Al_2O_3/Si$, or combinations of said substrates.

12. The buried channel graphene device of claim 10 in which the gate dielectric layer is selected from the group consisting of silicon oxide, silicon nitride, silicon oxynitride and gate stacks with silicon oxide, silicon nitride or silicon oxynitride as bottom layer and high-k gate dielectrics as top layer.

13. The buried channel graphene device of claim 10 in which the source and drain contacts are selected from the group consisting of Ti, Pd, Au, Al, TiN, TaN, W and combination of these metals.

14. The buried channel graphene device of claim 10 in which the source and drain contact contains a metal layer and a silicide layer.

15. The buried channel graphene device of claim 10 in which the source and drain contact contains only a metal layer.

* * * * *